(12) United States Patent
Yu et al.

(10) Patent No.: US 8,167,146 B2
(45) Date of Patent: May 1, 2012

(54) CABLE MANAGEMENT APPARATUS

(75) Inventors: Mo-Ming Yu, Shenzhen (CN); Hai-Chen Zhou, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 445 days.

(21) Appl. No.: 12/166,264

(22) Filed: Jul. 1, 2008

(65) Prior Publication Data

US 2009/0261212 A1 Oct. 22, 2009

(30) Foreign Application Priority Data

Apr. 16, 2008 (CN) .......................... 2008 1 0301152

(51) Int. Cl.
*A47F 7/00* (2006.01)
(52) U.S. Cl. ................ 211/26; 248/56; 248/49; 248/51; 248/65; 248/74.1; 211/175; 211/189
(58) Field of Classification Search .................... 248/56, 248/49, 51, 65, 74.1; 211/26, 175, 189; 361/826, 361/727, 756
See application file for complete search history.

(56) References Cited

U.S. PATENT DOCUMENTS

| | | | |
|---|---|---|---|
| 5,893,539 A * | 4/1999 | Tran et al. ..................... 248/68.1 |
| 5,921,402 A * | 7/1999 | Magenheimer ................. 211/26 |
| 6,305,556 B1 * | 10/2001 | Mayer ............................. 211/26 |
| 6,326,547 B1 * | 12/2001 | Saxby et al. .................... 174/69 |
| 6,327,139 B1 | 12/2001 | Champion et al. |
| 6,435,354 B1 * | 8/2002 | Gray et al. ....................... 211/26 |
| 6,600,665 B2 * | 7/2003 | Lauchner ...................... 361/826 |
| 6,805,248 B2 * | 10/2004 | Champion et al. .............. 211/26 |
| 6,902,069 B2 * | 6/2005 | Hartman et al. ................. 211/26 |
| 6,972,949 B1 | 12/2005 | Helgenberg et al. |
| 7,009,112 B1 * | 3/2006 | Mead et al. ..................... 174/69 |
| 7,121,412 B2 * | 10/2006 | Richards et al. ................. 211/26 |
| 7,168,576 B2 * | 1/2007 | Williams ......................... 211/26 |
| 7,189,924 B1 * | 3/2007 | Popescu et al. .................. 174/69 |
| 7,201,279 B1 * | 4/2007 | Mimlitch et al. ................ 211/26 |
| 7,317,623 B2 * | 1/2008 | Nguyen et al. ................ 361/826 |
| 7,472,795 B2 * | 1/2009 | Dubon et al. .................... 211/26 |
| 7,473,846 B2 * | 1/2009 | Doerr et al. ..................... 174/69 |
| 7,554,819 B2 * | 6/2009 | Chen et al. .................... 361/826 |
| 7,654,398 B2 * | 2/2010 | Bridges et al. .................. 211/26 |
| 2003/0026084 A1 | 2/2003 | Lauchner |
| 2003/0222034 A1 | 12/2003 | Champion et al. |
| 2004/0120133 A1 * | 6/2004 | Nguyen et al. ................ 361/825 |
| 2004/0120134 A1 | 6/2004 | Nguyen et al. |
| 2005/0145582 A1 * | 7/2005 | Dubon et al. .................... 211/26 |
| 2006/0113433 A1 * | 6/2006 | Chen et al. ...................... 248/70 |
| 2006/0118685 A1 * | 6/2006 | Schluter et al. ................ 248/244 |
| 2009/0065658 A1 * | 3/2009 | Chen et al. ...................... 248/70 |
| 2009/0078834 A1 * | 3/2009 | Chen et al. ...................... 248/70 |

\* cited by examiner

*Primary Examiner* — Nkeisha Smith
(74) *Attorney, Agent, or Firm* — Altis Law Group, Inc.

(57) ABSTRACT

A cable management apparatus includes a cable support, and a connecting member. The cable support includes a first support and a second support. A rail assembly includes an outer rail and an inner rail slidably attached to the outer rail. The first support is rotationally attached to the inner rail and the second support is rotationally attached to the outer rail. The connecting member connects the first and second supports and extends a blocking portion. The first support is capable of changing position relative to the second support while the inner rail and the outer rail stay relatively static. The blocking portion is supported by the supporting member and is capable of disengaging from the supporting member.

12 Claims, 7 Drawing Sheets

CABLE MANAGEMENT APPARATUS

BACKGROUND

1. Field of the Invention

The present invention relates to an accessory of a server cabinet, and more particularly to a cable management apparatus attached to a server cabinet to manage the cables connected to a server.

2. Description of Related Art

Generally, a server is installed in a cabinet via a pair of rail assemblies. A cable management apparatus is attached to the cabinet behind the server to manage the cables of the server to ensure that the cables are well ordered. The cable management apparatus generally includes a first supporting arm pivotably connected with a second supporting arm. The first and second supporting arms are attached to a rail assembly, and can rotate relative to each other when the server moves with the rail assemblies. But, when the server stays stationary, the first and second supporting arms can not rotate any more and block the access to the rear part of the sever.

Because of the existence of the above cable management apparatus, maintenance of the components behind the server such as power supply modules becomes inconvenient. The cable management apparatus must be detached from the cabinet to provide access for the maintenance.

What is desired, therefore, is a cable management apparatus that facilitates the maintenance of servers.

DETAILED DESCRIPTION

Figure 1:
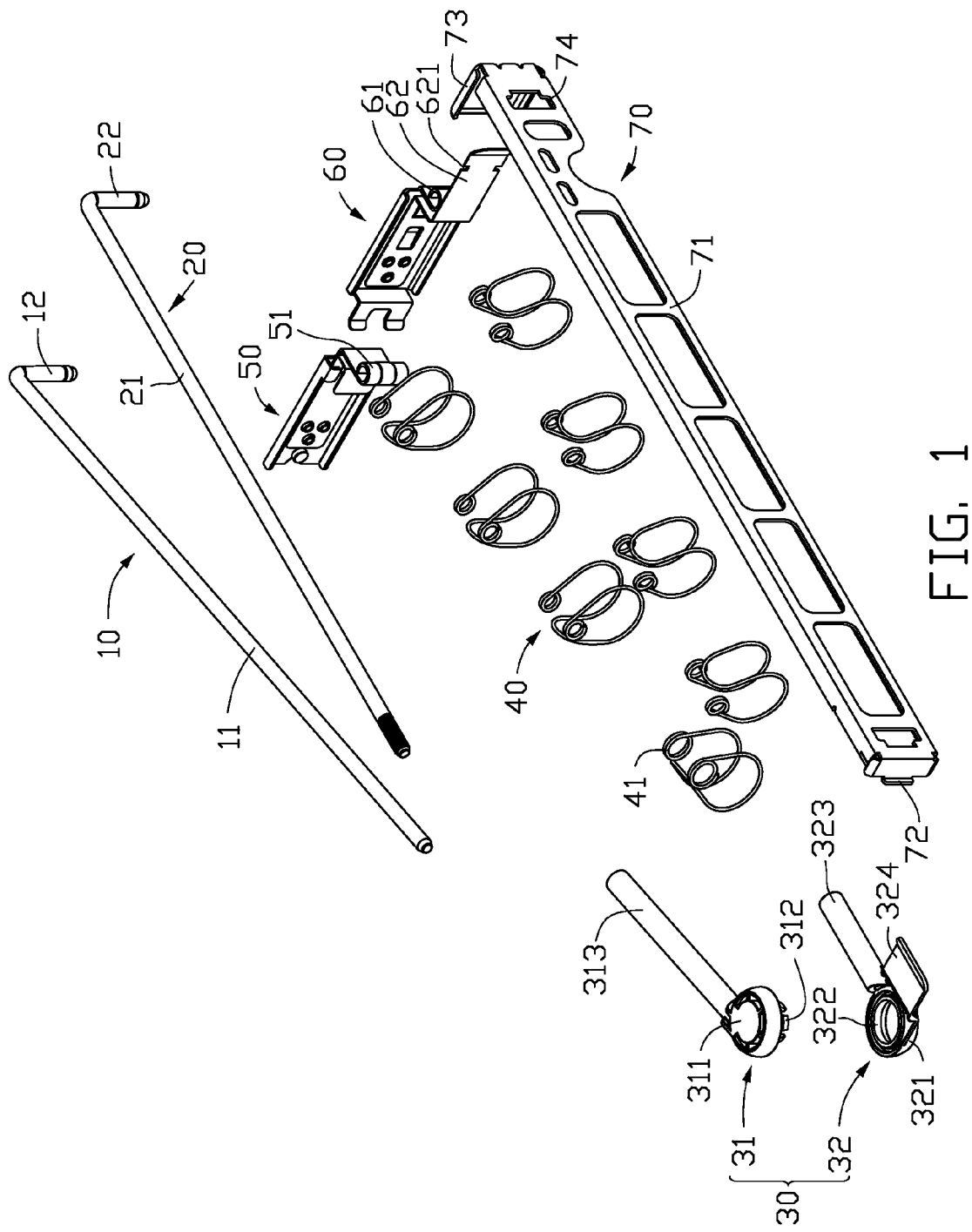
FIG. 1 is an exploded, isometric view of a cable management apparatus in accordance with a first embodiment of the present invention.
Figure 2:
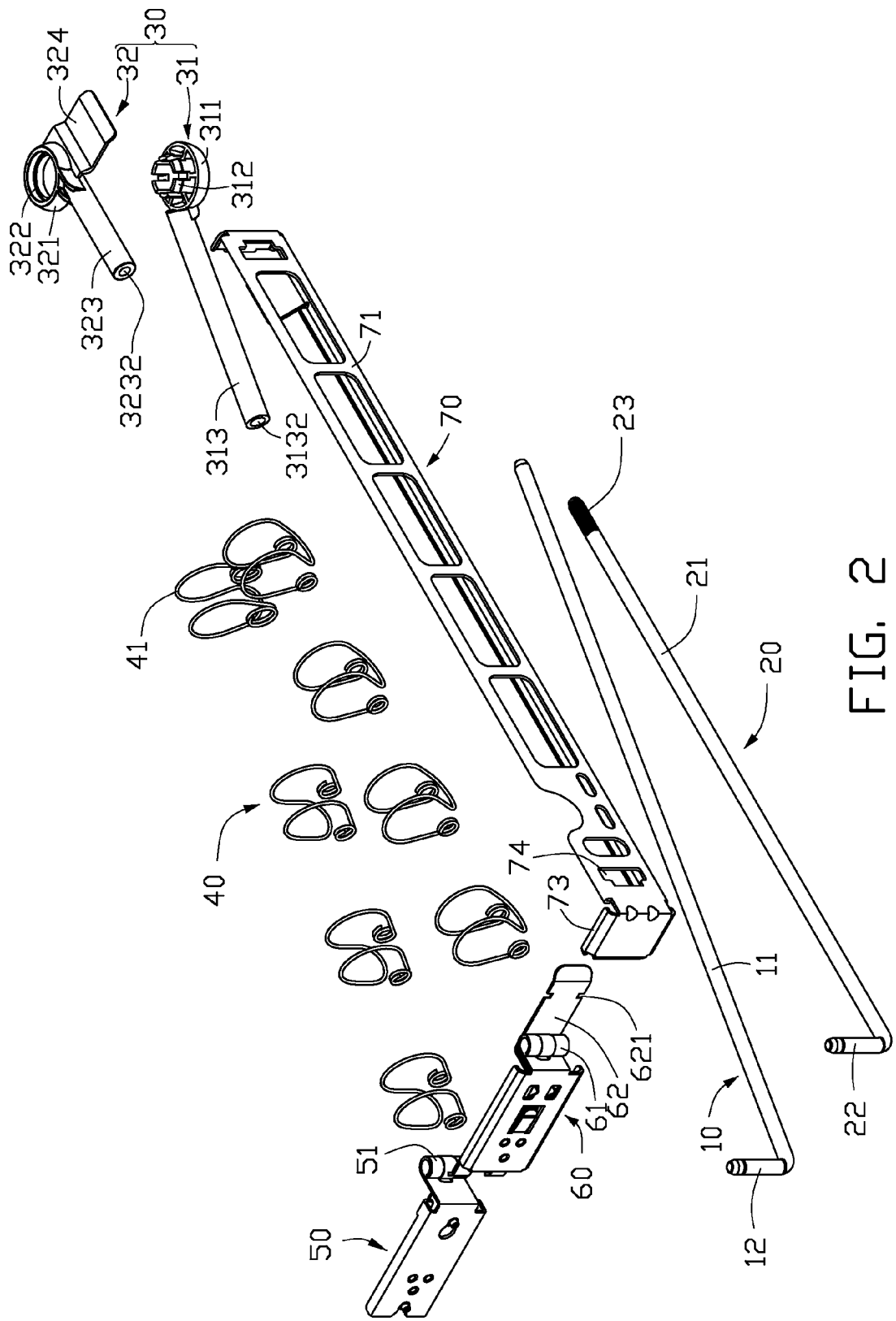
FIG. 2 is similar to FIG. 1, but an inverted view.
Figure 4:
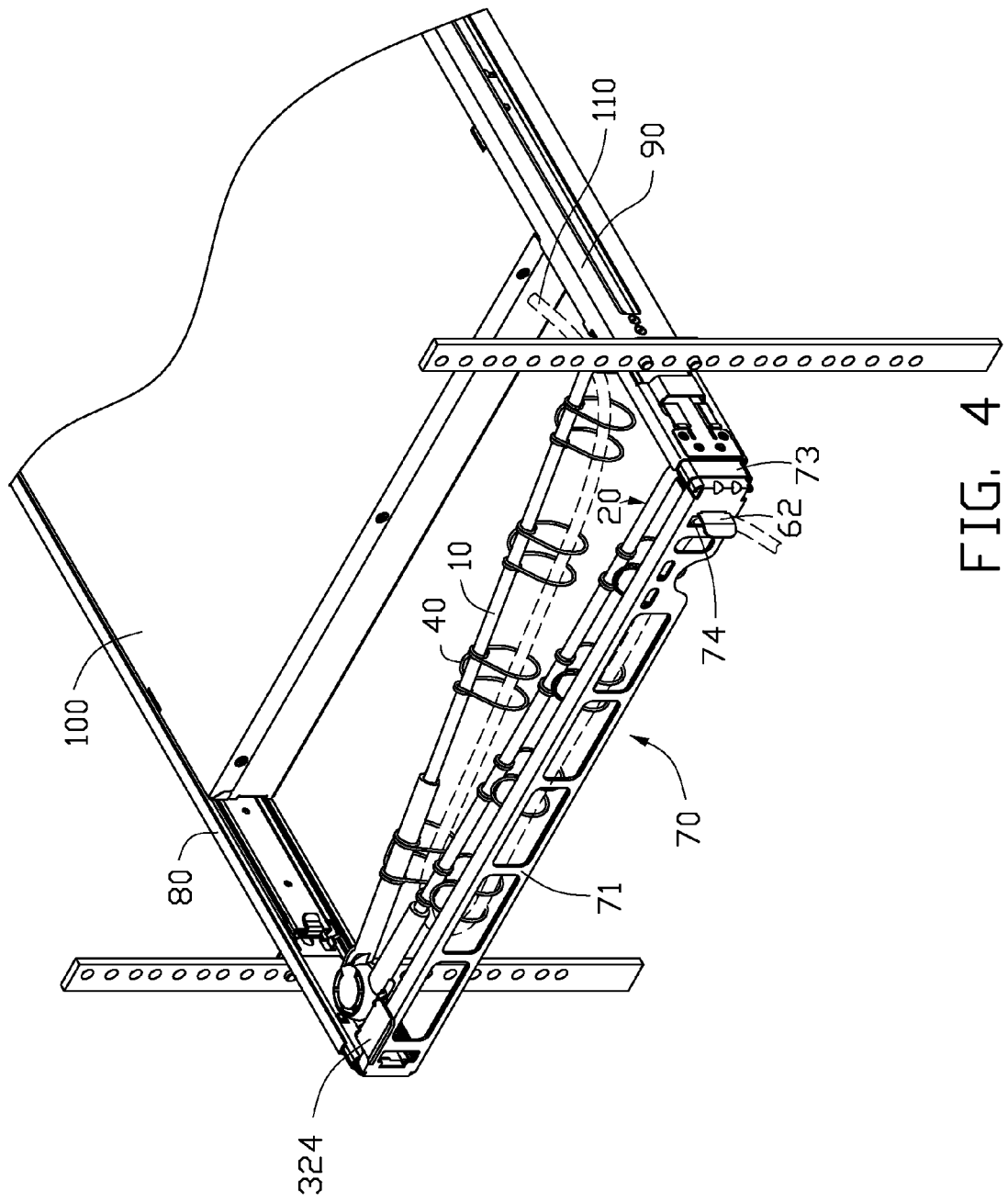
FIGS. 4 and 5 are assembled views of the cable management apparatus of FIG. 1, two rail assemblies, and a server, showing two using states respectively.

Referring to FIGS. 1, 2 and 4, a cable management apparatus in accordance with a first embodiment of the present invention is attached between a first rail assembly 80 and a second rail assembly 90, for managing cables 110 extending from a rear end of a server 100. The cable management apparatus includes a first supporting arm 10, a second supporting arm 20, a connecting member 30, a plurality of cable retainers 40, a first locking member 50, a second locking member 60, and a supporting member 70.

Figure 5:
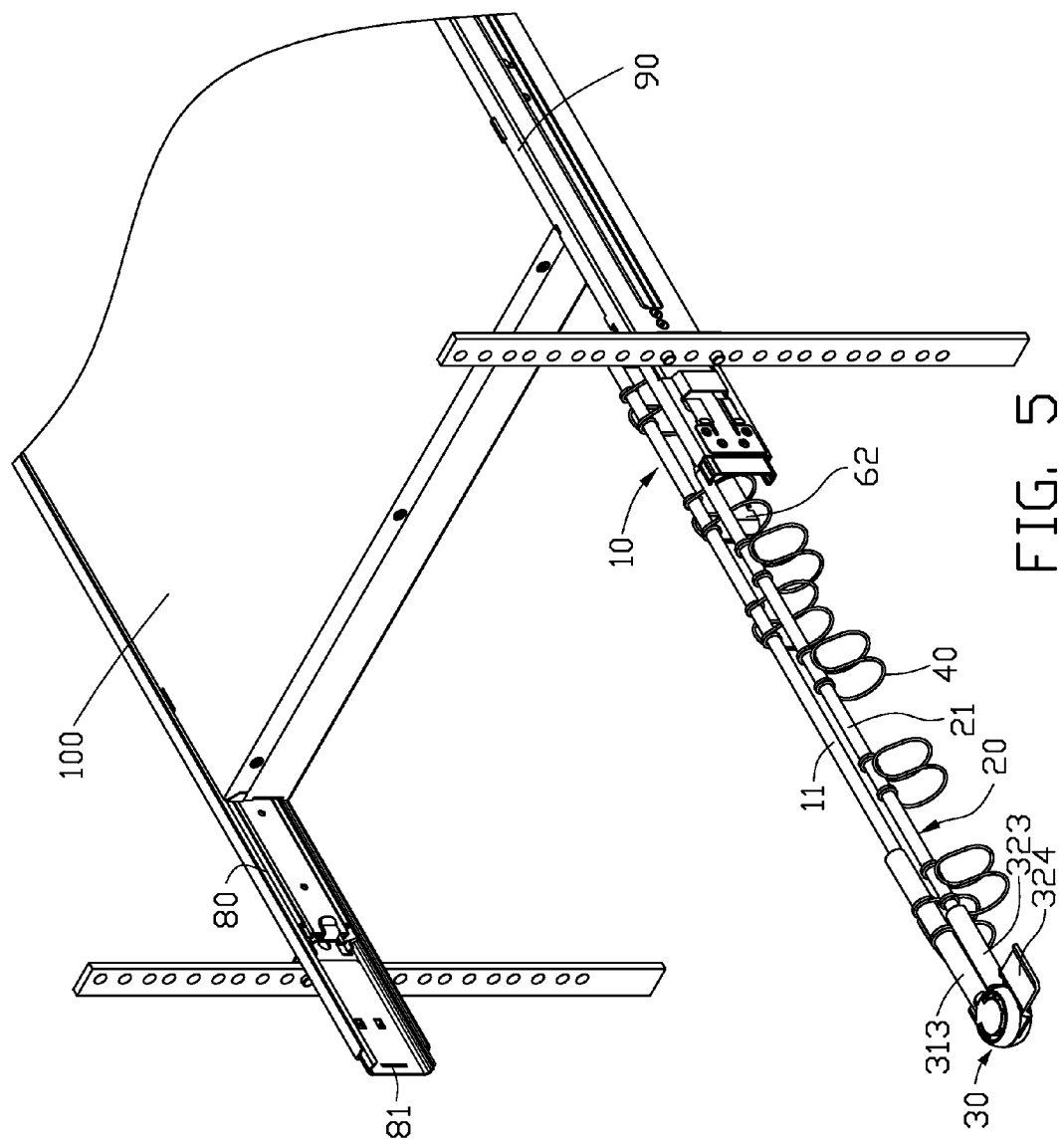

A rear end of the first rail assembly 80 defines a fixing hole 81 (see FIG. 5).

The first supporting arm 10 is approximately L-shaped, and includes a pole-shaped supporting portion 11, and a pivot portion 12 vertically extending from a first end of the supporting portion 11.

The second supporting arm 20 is approximately L-shaped, and includes a pole-shaped supporting portion 21, a pivot portion 22 vertically extending from a first end of the supporting portion 21, and a threaded portion 23 defined at a second end of the supporting portion 21.

The connecting member 30 includes a first connecting part 31 and a second connecting part 32. The first connecting part 31 includes a tube 313, a discoid-shaped hook portion 311 extending from an end of the tube 313, and a plurality of circularly distributed hooks 312 vertically extending from a circumference of a bottom of the hook portion 311. The tube 313 defines an axial hole 3132 therein. The second connecting part 32 includes a fixing pole 323, a discoid-shaped receiving portion 321 extending from an end of the fixing pole 323, and a blocking portion 324 radially extending outward from the receiving portion 321. The receiving portion 321 defines a stepped hole in a middle thereof. The other end of the fixing pole 323 axially defines a threaded hole 3232, corresponding to the threaded portion 23 of the second supporting arm 20.

Each cable retainer 40 may be formed by a wire bent into a U-shape. Distal ends 41 thereof are coiled and in axial alignment to receive a corresponding pole-shape supporting portion 11, 21 therethrough. The middle portion is bent toward the coiled ends 41 to form a hook like structure.

The first locking member 50 is approximately L-shaped, and includes an attaching portion and an extending portion vertically bent from one end of the attaching portion. A pivot part 51 is formed at a distal end of the extending portion.

The second locking member 60 includes an attaching portion, an extending portion vertically bent from one end of the attaching portion, and an elastic part 62 vertically bent from a distal end of the extending portion. A pivot part 61 is formed at an outer surface of the extending portion. Two cutouts 621 are respectively defined at opposite sides of the free end of the elastic part 62.

The supporting member 70 includes a supporting portion 71, a protrusion 72 extending outward from one end of the supporting portion 71, and a fixing portion 73 vertically bent from the other end of the supporting portion 71. The supporting portion 71 defines a fixing hole 74 adjacent the fixing portion 73. The fixing hole 74 includes a greater section and a smaller section communicating with the greater section.

Figure 3:
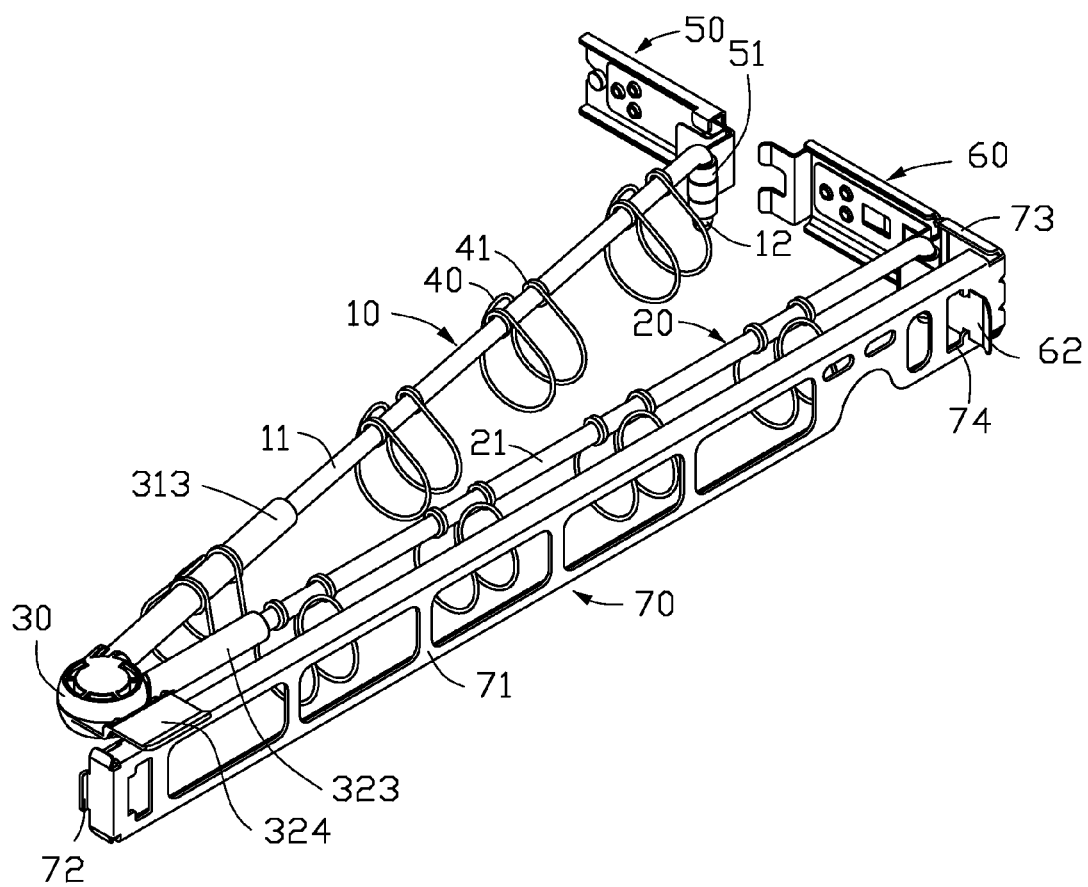
FIG. 3 is an assembled view of FIG. 1.

Referring also to FIGS. 3 to 5, in assembly, the hooks 312 of the first connecting part 31 of the connecting member 30 is extended into the stepped hole 322 of the second connecting part 32 from the smaller hole of the stepped hole 322, and engaged with the step of the stepped hole 322. The first connecting part 31 is rotationally mounted to the second connecting part 32. The cable retainers 40 are positioned on the tube 313 of the first connecting part 31, the supporting portion 11 of the first supporting arm 10, or the supporting portion 21 of the second supporting arm 20, via their coiled ends 41. The cable 110 can be retained by the cable retainers 40. The supporting portion 11 of the first supporting arm 10 is slidably received in the axial hole 3132 of the tube 313 of the first connecting part 31, and the threaded portion 23 of the second supporting arm 20 is screwed into the threaded hole 3232 of the fixing pole 323 of the second connecting part 32 of the connecting member 30. The pivot portion 12 of the first supporting arm 10 and the pivot portion 22 of the second supporting arm 20 are respectively rotationally received in the pivot part 51 of the first locking member 50 and the pivot part 61 of the second locking member 60. The attaching portions of the first locking member 50 and the second locking member 60 are respectively fixed to rear ends of an inner rail and an outer rail of the second rail assembly 90. The protrusion 72 of the supporting member 70 is engaged in the fixing hole 81 of the first rail assembly 80. The fixing portion 73 of the supporting member 70 is inserted into an inner side of the outer rail of the second rail assembly 90. The elastic part 62 of the second locking member 60 is elastically deformed and passes through the greater section of the fixing hole 74 of the supporting member 70. The elastic part 62 of the second locking member 60 restores and moves into the smaller section of the fixing hole 74, and the cutouts 621 of the elastic part 62 are engaged with opposite edges of the smaller section of the fixing hole 74.

When the server 100 is completely accommodated in the cabinet, a top of the supporting portion 71 of the supporting member 70 supports the blocking portion 324 of the second connecting part 32 of the connecting member 30, to prevent the cable management apparatus from damage because of supporting heavy cables 110 for a long time.

When the server is moved forwards on the rail assemblies 80, 90, the cables 110 are supported by the cable retainers 40 and the first supporting arm 10 rotates relative to the second supporting arm 20. The cables 110 also supplies a force to prevent the supporting portion 11 of the first supporting arm 10 from sliding in the tube 313 of the first connecting part 31 of the connecting member 30. The blocking portion 324 is moved off of the supporting member 70. The cables 110 are maintained in a well ordered manner such that when the server is pushed back, the cables 110 do not get in the way of the server progress.

When components of the server 100 need to be maintenanced, the elastic part 62 of the second locking member 60 is moved into the greater section of the fixing hole 74 of the supporting member 70 against its elasticity. The fixing portion 73 of the supporting member 70 is drawn out of the outer rail of the second rail assembly 90, and the protrusion 72 of the supporting member 70 is disengaged from the fixing hole 81 of the first rail assembly 80 to detach the supporting member 70. The pivot portion 12 of the first supporting arm 10 and the pivot portion 22 of the second supporting arm 20 are respectively pivoted in the pivot part 51 of the first locking member 50 and the pivot part 61 of the second locking member 60. The first supporting arm 10 and the second supporting arm 20 can move toward the second rail assembly 90. The supporting portion 11 of the first supporting arm 10 slides in the tube 313 of the first connecting part 31 of the connecting member 30, until the first supporting arm 10 and the second supporting arm 20 are juxtaposed, and located beside the second rail assembly 90 to leave a space for the technicians to maintain the components of the server 100. Thus, the relative lengths of two sides the respective triangle can be altered allowing easy service of the servers.

Figure 6:
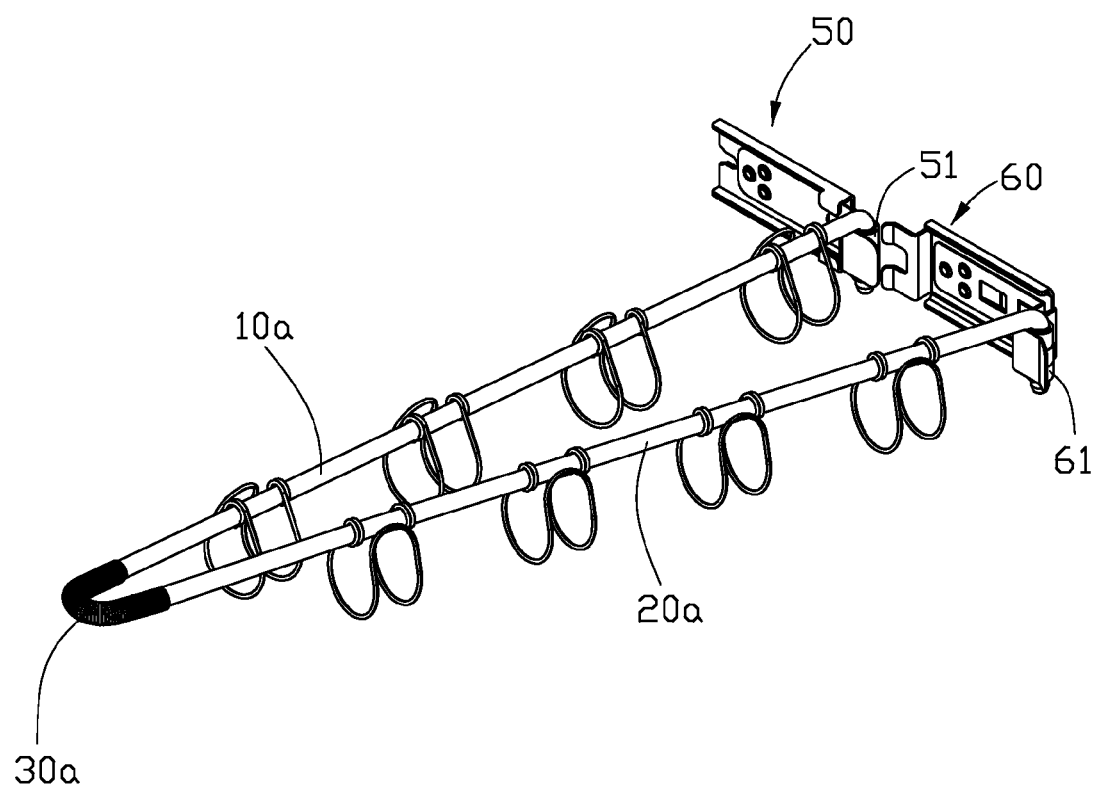
FIG. 6 is an assembled, isometric view of a cable management apparatus in accordance with a second embodiment of the present invention.
Figure 7:
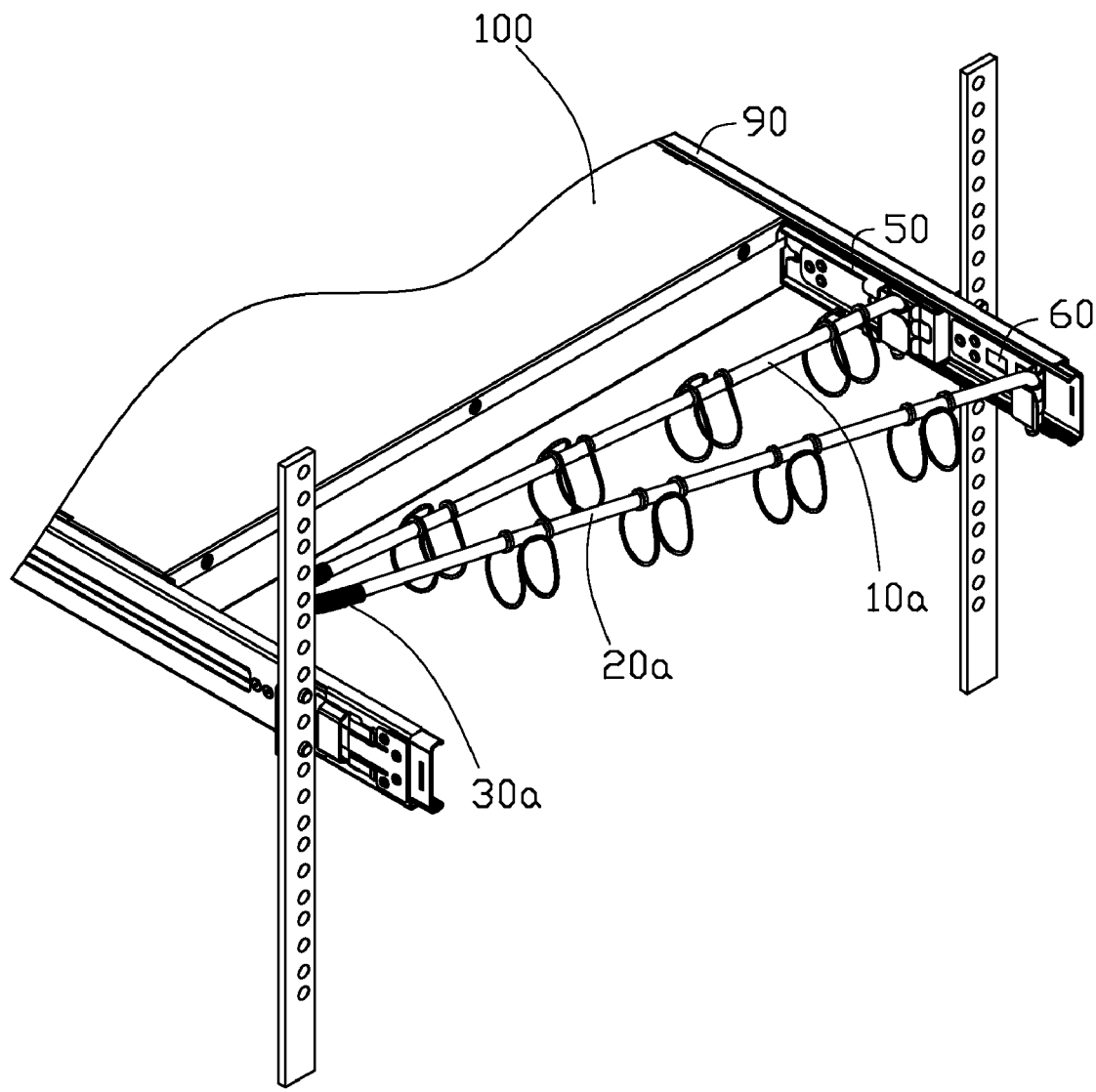
FIG. 7 is an assembled, isometric view of the cable management apparatus of FIG. 6, two rail assemblies, and a server, showing a using state.

Referring also to FIGS. 6 and 7, a cable management apparatus in accordance with a second embodiment of the present invention is similar to that of the first embodiment. The cable management apparatus of this embodiment includes a first supporting arm 10a, a second supporting arm 20a, and a connecting member 30a. The connecting member 30a is a helical spring, and both ends of the helical spring are fixed to the corresponding ends of the first supporting arm 10a and the second supporting arm 20a. When components of the server 100 need to be maintenanced. In virtue of the flexibility of the connecting member 30a, the pivot portions of the first supporting arm 10a and the second supporting arm 20a are respectively pivoted in the pivot part 51 of the first locking member 50 and the pivot part 61 of the second locking member 60, until the first and the second supporting arms 10a, 20a are juxtaposed, and located beside the second rail assembly 90, to leave a space for the technicians to maintain the components of the server 100. Thus, the relative lengths of two sides the respective triangle can be altered allowing easy service of the servers.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A cable management apparatus, the cable management apparatus comprising:
    a rail assembly comprising of an outer rail and an inner rail slidably attached to the outer rail;
    a first support comprising of a first support section and a first rotation section, wherein the first rotation section is rotationally attached to the inner rail;
    a second support comprising of a second support section and a second rotation section, wherein the second rotation section is rotationally attached to the outer rail; and
    a connecting member connected to the first support section and the second support section to rotatably link the first support section with the second support section, wherein the connecting member comprises a first connecting part linearly slidably connected to the first support section of the first support and a second connecting part fixed to the second support section of the second support, and the first connecting part and the second connecting part are rotationally engaged with each other;
    wherein at least one of the first support section and the second support section is extendable relative to the connecting member and is thereby extendable toward or away from the rail assembly.

2. The cable management apparatus as claimed in claim 1, wherein the inner rail comprises a first locking member and the outer rail comprises a second locking member, and the first rotation section is pivotally coupled to the first locking member and the second rotation section is pivotally coupled to the second locking member.

3. The cable management apparatus as claimed in claim 1, wherein the first connecting part comprises a tube slidably receiving the first support section of the first support.

4. The cable management apparatus as claimed in claim 1, wherein the second support section defines a threaded portion and the second connecting part defines a corresponding threaded portion; and the threaded portion of the second support section is engaged with the threaded portion of the second connecting part.

5. The cable management apparatus as claimed in claim 1, further comprising a plurality of cable retainers, wherein at lease one cable retainer is located on each of the first and second supports.

6. The cable management apparatus as claimed in claim 5, wherein each cable retainer is comprised of a wire bent into a U-shape; two coiled portions in axial alignment with each other are formed at opposite ends of the wire; and a middle portion of the wire extends towards the coiled portions to form a hook like structure.

7. A cable management apparatus, the cable management apparatus comprising:
a first rail assembly and a second rail assembly that are opposite and parallel to each other;
a cable support member;
a blocking portion extending from the cable support member; and
a supporting member removably attached to the first and second rail assemblies;
wherein the blocking portion is supported by the supporting member and is capable of disengaging from the supporting member;
wherein the first rail assembly comprises an outer rail and an inner rail slidably attached to the outer rail; the cable support member comprises a first support rotationally attached to the inner rail, a second support rotationally attached to the outer rail, and a connecting member connecting the first and second supports; and the blocking portion extends from the connecting member; and
wherein the supporting member comprises:
a supporting portion that engages the blocking portion;
a protrusion extending from a supporting member first end that is engaged with a rear end of the second rail assembly;
a fixing portion extending from a supporting member second end that is engaged with a rear end of the first rail assembly; and
a fixing hole defined in the supporting portion adjacent the fixing portion, the fixing hole engages with an elastic part of the first rail assembly.

8. The cable management apparatus as claimed in claim 7, wherein the inner rail comprises a first locking member and the outer rail comprises a second locking member, and the first support is attached to the first locking member and the second support is attached to the second locking member.

9. The cable management apparatus as claimed in claim 8, wherein the elastic part is attached to the second locking member.

10. The cable management apparatus as claimed in claim 7, wherein two cutouts are defined in opposite sides of the elastic part to engage, respectively, with sides of the fixing hole of the supporting portion.

11. A cable management apparatus, the cable management apparatus comprising:
a first rail assembly and a second rail assembly that are opposite and parallel to each other, the first rail assembly comprising an outer rail and an inner rail slidably attached to the outer rail; and
a cable support member, the cable support member comprising:
a first support comprising of a first support section and a first rotation section, wherein the first rotation section is rotationally attached to the inner rail;
a second support comprising of a second support section and a second rotation section, wherein the second rotation section is rotationally attached to the outer rail; and
a connecting member connecting the first support section of the first support and the second support section of the second support to make the first support section rotatable relative to the second support section, wherein at least one of the first support section and the second support section is extendable relative to the connecting member and is thereby extendable toward or away from the rail assembles;
wherein the connecting member comprises a first connecting part telescopically receiving the first support section of the first support and a second connecting part fixed to the second support section of the second support, and the first connecting part and the second connecting part are rotationally engaged with each other.

12. The cable management apparatus as claimed in claim 11, further comprising: a blocking portion extending from the connecting member of the cable support member; and a supporting member removably attached to the first and second rail assemblies; wherein the inner rail of the first rail assembly is slidable between a retracted position and an extending position relative to the outer rail of the first rail assembly, the blocking portion is supported by the supporting member in response to the inner rail of the first rail assembly sliding to the retracted position, and the blocking portion is configured to disengage the supporting member in response to the inner rail of the first rail assembly sliding to the extending position.

* * * * *